(12) United States Patent
Kordesch et al.

(10) Patent No.: US 7,132,701 B1
(45) Date of Patent: Nov. 7, 2006

(54) CONTACT METHOD FOR THIN SILICON CARBIDE EPITAXIAL LAYER AND SEMICONDUCTOR DEVICES FORMED BY THOSE METHODS

(75) Inventors: Martin E. Kordesch, The Plains, OH (US); Howard D. Bartlow, Nampa, ID (US); Richard L Woodin, Austin, TX (US)

(73) Assignee: Fairchild Semiconductor Corporation, South Portland, ME (US)

( * ) Notice: Subject to any disclaimer, the term of this patent is extended or adjusted under 35 U.S.C. 154(b) by 1 day.

(21) Appl. No.: 09/682,151

(22) Filed: Jul. 27, 2001

(51) Int. Cl.
*H01L 29/737* (2006.01)
*H01L 21/331* (2006.01)

(52) U.S. Cl. .............. 257/198; 438/318; 257/E29.188; 257/E21.371; 257/E21.541

(58) Field of Classification Search ........ 257/183–201, 257/741, 743, 744, 745; 437/318
See application file for complete search history.

(56) References Cited

U.S. PATENT DOCUMENTS

| | | | | |
|---|---|---|---|---|
| 3,633,077 A | * | 1/1972 | Tsuji et al. | 257/461 |
| 3,866,310 A | * | 2/1975 | Driver et al. | 438/571 |
| 4,683,487 A | * | 7/1987 | Ueyanagi et al. | 257/197 |
| 4,889,821 A | * | 12/1989 | Selle et al. | 438/320 |

(Continued)

FOREIGN PATENT DOCUMENTS

JP  63142867 A * 6/1988

OTHER PUBLICATIONS

Luo et al., "Demonstration of 4H-SiC power bipolar junction transistors," Electronic Letters, Aug. 17, 2000, vol. 36, No. 17, pp. 1496-1497.*

(Continued)

*Primary Examiner*—Jerome Jackson
(74) *Attorney, Agent, or Firm*—Thomas R. FitzGerald, Esq; Hiscock & Barclay, LLP

(57) ABSTRACT

Provided is a process for forming a contact for a compound semiconductor device without electrically shorting the device. In one embodiment, a highly doped compound semiconductor material is electrically connected to a compound semiconductor material of the same conductivity type through an opening in a compound semiconductor material of the opposite conductivity type. Another embodiment discloses a transistor including multiple compound semiconductor layers where a highly doped compound semiconductor material is electrically connected to a compound semiconductor layer of the same conductivity type through an opening in a compound semiconductor layer of the opposite conductivity type. Embodiments further include metal contacts electrically connected to the highly doped compound semiconductor material. A substantially planar semiconductor device is disclosed. In embodiments, the compound semiconductor material may be silicon carbide.

14 Claims, 5 Drawing Sheets

U.S. PATENT DOCUMENTS

| | | | |
|---|---|---|---|
| 4,945,394 A | 7/1990 | Palmour et al. | |
| 4,949,162 A * | 8/1990 | Tamaki et al. | 257/499 |
| 5,296,391 A | 3/1994 | Sato et al. | 437/31 |
| 5,396,087 A * | 3/1995 | Baliga | 257/139 |
| 5,409,859 A | 4/1995 | Glass et al. | 437/187 |
| 5,591,651 A * | 1/1997 | Chen | 438/362 |
| 5,670,803 A * | 9/1997 | Beilstein, Jr. et al. | 257/278 |
| 5,698,871 A * | 12/1997 | Sakai et al. | 257/197 |
| 5,736,863 A * | 4/1998 | Liu | 324/765 |
| 5,939,738 A | 8/1999 | Morris | |
| 5,980,265 A | 11/1999 | Tischler | 437/185 |
| 5,982,036 A | 11/1999 | Uchibori et al. | |
| 6,127,695 A * | 10/2000 | Harris et al. | 257/77 |
| 6,218,254 B1 | 4/2001 | Singh et al. | 438/364 |
| 6,271,097 B1 * | 8/2001 | Morris | 438/312 |
| 6,287,930 B1 * | 9/2001 | Park | 438/369 |
| 6,313,488 B1 * | 11/2001 | Bakowski et al. | 257/198 |
| 6,329,675 B1 * | 12/2001 | Singh et al. | 257/77 |
| 6,399,971 B1 * | 6/2002 | Shigematsu et al. | 257/197 |
| 2003/0157745 A1* | 8/2003 | Zeghbroeck et al. | 438/105 |

OTHER PUBLICATIONS

Tang et al., "An Implanted-Emitter 4H-SiC Bipolar Transistor with High Current Gain," IEEE Electron Device Letters, vol. 22, No. 4, Mar. 2001, pp. 119-120.*

* cited by examiner

CONTACT METHOD FOR THIN SILICON CARBIDE EPITAXIAL LAYER AND SEMICONDUCTOR DEVICES FORMED BY THOSE METHODS

GOVERNMENTAL RIGHTS

The U.S. Government has a paid-up license in this invention and the right in limited circumstances to require the patent owner to license others on reasonable terms as provided by the terms of F33615-01-C-1602 awarded by the Air Force Research Laboratory.

BACKGROUND OF INVENTION

1. Field of the Invention

The present invention relates to methods of making semiconductor devices and in particular to methods of providing ohmic contacts to compound semiconductor layers utilized in semiconductor devices.

2. Description of the Related Art

The fabrication and operation of basic transistor devices is well known. New technologies have developed needs for higher speed and power transistors capable of withstanding extreme operating conditions such as high temperatures, current, and radiation. Silicon carbide devices have the potential to fulfill these needs but have yet to achieve commercial success. One obstacle to using silicon carbide in electronic devices is the difficulty in providing electrical contacts to the device.

Electrical contacts to silicon carbide may be formed by reacting a contact metal with silicon carbide. One such method involves melting an alloy on the surface of silicon carbide. When the alloy melts, it dissolves and reacts with a small portion of the silicon carbide to form a contact. A second method of creating a contact involves laminating the surface of the silicon carbide with a contact metal. When annealed, this metal reacts with the silicon carbide to form an ohmic contact. The first method results in a contact that is too large for use in miniature devices. Annealing temperatures in the second method would be destructive to insulating layers. Both methods are incompatible with semiconductor devices having thin silicon carbide layers because of problems with metal spiking.

In order to prevent metal spiking, barrier layers between the contact metal and silicon carbide may be used. In one method a portion of doped silicon carbide is bombarded with ions to produce a heavily doped barrier region to which contact is made. Alternatively, a silicide barrier layer may be formed during annealing. Both of these methods are impractical for forming contacts to thin silicon carbide layers. Ion bombardment is not feasible for thin silicon carbide layers because the highly doped region is likely to extend through the entire layer and into an underlying layer. Similarly, the formation of a silicide barrier layer may electrically short a thin silicon carbide layer to an underlying layer because the reaction can consume the entire thickness of the thin silicon carbide layer and a portion of the underlying layer.

SUMMARY OF INVENTION

In embodiments described below, the process overcomes the problems above to enable the creation of microscopic contacts and is thus compatible with modern, miniature devices. Another benefit of the described embodiments is that insulating layers created during the process are preserved because of lower process temperatures. Finally, the embodiments described may be used with thin silicon carbide layers without causing electrical shorts through the layer.

In one set of embodiments, a process for forming a contact to a compound semiconductor layer can comprise forming a first compound semiconductor layer over a substrate. The first compound semiconductor layer may have a first conductivity type. The process can also comprise forming a second compound semiconductor layer. The second compound semiconductor layer may have a second conductivity type that is opposite the first conductivity type. The process can further comprise forming a third compound semiconductor layer. The third compound semiconductor layer may have the first conductivity type. The process can still further comprise patterning the third compound semiconductor layer to define an opening with a wall. The process can also comprise forming an insulating material along the wall, and forming a fourth compound semiconductor layer at least partially within the opening. The fourth compound semiconductor layer may have the second conductivity type and a dopant concentration that is higher than a dopant concentration of the second compound semiconductor layer. The fourth compound semiconductor layer may also be electrically connected to the second compound semiconductor layer and may be insulated from the third compound semiconductor layer.

In another set of embodiments, a semiconductor device can comprise a first active layer including a first compound semiconductor material and having a first conductivity type. The semiconductor device may also comprise a second active layer including a second compound semiconductor material and having a second conductivity type opposite the first conductivity type. The second active layer can contact the first active layer. The semiconductor device may further comprise a third active layer that includes a third compound semiconductor material having the first conductivity type. The third active layer can contact the second active layer, and a combination of the first, second, and third active layers can be at least part of a transistor. An opening may extend through the third active layer and contact the second active layer. The semiconductor device can still further comprise a fourth compound semiconductor material at least partially within the opening. The fourth compound semiconductor material may have the second conductivity type and a dopant concentration higher than a dopant concentration of the second active layer and may be electrically connected to the second active layer. The semiconductor device can also comprise a first insulating layer at least partially within opening. The first insulating layer may lie between the third active layer and the fourth compound semiconductor layer.

The foregoing general description and the following detailed description are exemplary and explanatory only and are not restrictive of the invention, as claimed.

BRIEF DESCRIPTION OF DRAWINGS

The present invention is illustrated by way of example and not limitation in the accompanying figures.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION

Reference is now made in detail to the exemplary embodiments of the invention, examples of which are illustrated in the accompanying drawings. Wherever possible, the same reference numbers will be used throughout the drawings to refer to the same or like parts (elements).

Described generally below is a process for fabricating an electrical connection between a metal contact and a thin layer of silicon carbide while reducing the likelihood of spiking of the silicon carbide layer. The contact process is described in the context of fabricating a planar, multi-layered silicon carbide device, but as one skilled in the art may surmise, it may be used for forming connections between any applicable metal and silicon carbide layer.

Figure 1:
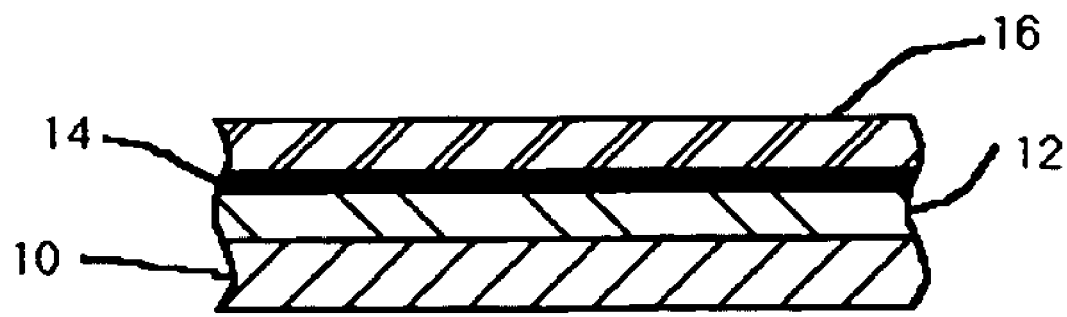
FIG. 1 includes an illustration of a cross-sectional view of a portion of a substrate after forming first, second, and third active layers.
Figure 2:
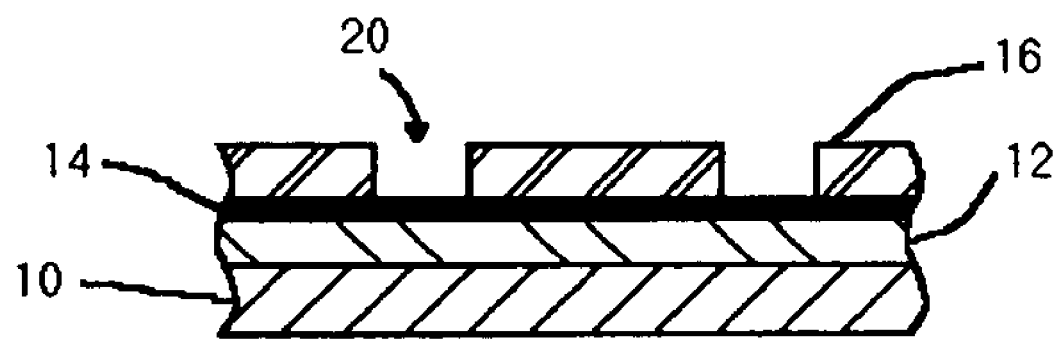
FIG. 2 includes an illustration of a cross-sectional view of the substrate of FIG. 1 after patterning the third active layer to define openings.

FIG. 1 includes an illustration of a portion of a substrate 10. The substrate 10 may include silicon carbide, gallium nitride, aluminum nitride, or other wide bandgap semiconductors. A wide bandgap material will have a bandgap of about 3 eV or greater. Active layers 12, 14, and 16 are sequentially formed over the substrate 10. Each of the active layers 12, 14, and 16 may be formed using conventional epitaxial growing techniques and comprise one or more compound semiconductor materials. A compound semiconductor includes at least two dissimilar elements that form a semiconductor material. In one specific example, at least two dissimilar Group IVA elements such as carbon, silicon, or germanium can be part of the semiconductor material. Silicon carbide (SiC) is an example of a compound semiconductor material having Group IVA elements. In this particular embodiment, layers 12, 14, and 16 can comprise SiC. SiC polytype 4H may be used as well as 6H, 3C, or other similarly reactive polytypes.

Layer 12 can have a thickness in a range of approximately 2–20 microns, can be n-type doped with nitrogen, phosphorus, or the like, and can have a dopant concentration in a range of approximately 1E15 to 1E18 atoms per cubic centimeter. Layer 14 can have a thickness in a range of approximately 0.1–2.0 microns, can be p-type doped with aluminum, boron, or the like, and have a dopant concentration in a range of approximately 1E15 to 1E17 atoms per cubic centimeters. Layer 16 can have a thickness in a range of approximately 0.5–2.0 microns, can be n-type doped with nitrogen, phosphorus, or the like, and have a dopant concentration in a range of approximately 1E17 to 1E19 per cubic centimeters. Layer 12 may be a collector, layer 14 may be a base, and layer 16 may be an emitter of a transistor.

Next, openings 20 can be formed by masking layer 16 with aluminum, nickel, or the like (not shown) and etching layer 16. The openings 20 extend through layer 16 and expose a portion of layer 14. A reactive ion etch (RIE) in an ionized $CF_4/O_2/H_2$ atmosphere may be used.

Figure 3:
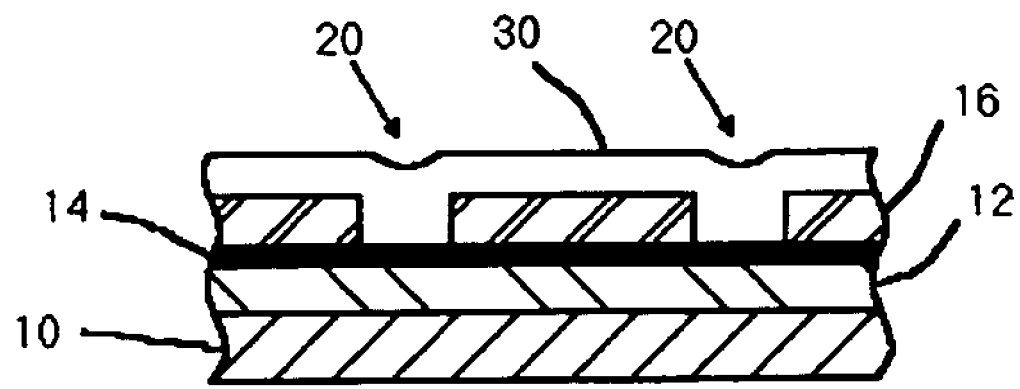
FIG. 3 includes an illustration of a cross-sectional view of the substrate of FIG. 2 after forming an insulating layer over the third active layer and within the openings.
Figure 4:
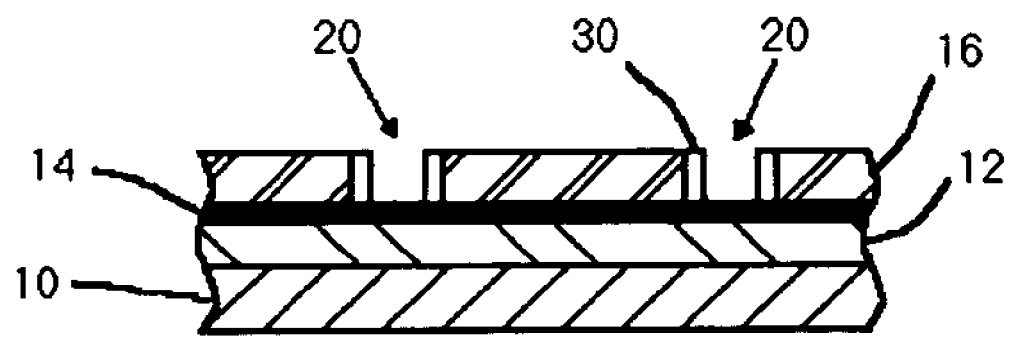
FIG. 4 includes an illustration of a cross-sectional view of the substrate of FIG. 3 after planarizing and etching the insulating layer to expose the second active layer at the bottom of the trenches.

An insulating layer 30, capable of being anisotropically etched, is then deposited on the exposed surfaces of layer 16 and at least partially within the openings 20 as shown in FIG. 3. An insulator such as silicon dioxide, silicon nitride, silicon oxynitride, or the like may be used for insulating layer 30. The insulating layer 30 can serve to passivate the walls of the opening 20 and insulate layer 16 from a subsequently formed material that may be electrically connected to layer 14. Portions of insulating layer 30 may be mechanically or chemically removed to expose layer 16. Then insulating layer 30 is masked and the insulating material in the openings 20 is anisotropically etched to expose a portion of layer 14 as illustrated in FIG. 4. A typical anisotropic etch may be a $CF_4/O_2$-based reactive ion etch.

Figure 5:
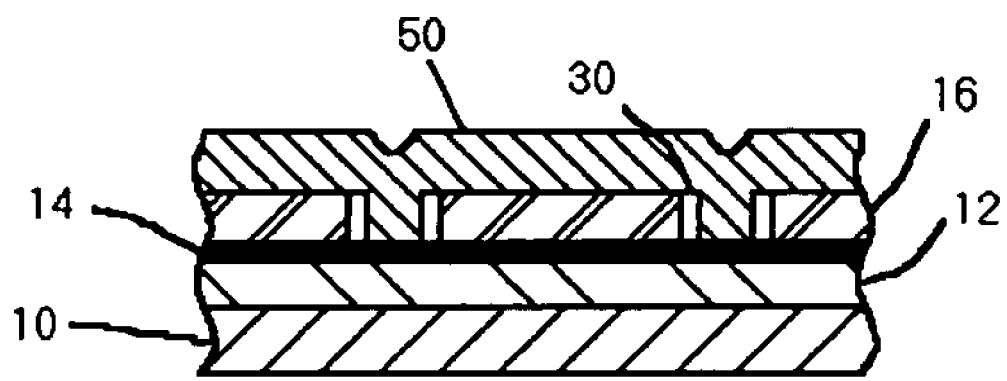
FIG. 5 includes an illustration of a cross-sectional view of the substrate of FIG. 4 after forming a layer of heavily doped silicon carbide deposited in the trenches.

As shown in FIG. 5, a heavily doped SiC layer 50 is then sputtered on to layer 14. The layer 50 may be RF sputtered at a power in the range of approximately 100–200 watts using a SiC target. Sputtering may be done at low pressure in the range of approximately 50–200 mTorr, in the presence of a non-reactive gas such as argon. During sputtering, the substrate may be held at a temperature in a range of approximately 800° C. 1100° C., which is below the melting temperature of the insulating layer 30, which is roughly 1100° C.

The desired dopant concentration for the SiC layer 50 is in the range of approximately 1E19–1E20 atoms per cubic centimeter. Dopants can be incorporated by simultaneously co-sputtering, DC sputtering, or by sputtering in the presence of a gas. For example, aluminum may be incorporated by simultaneously co-sputtering, DC sputtering from an aluminum target, or by sputtering in the presence of gaseous trimethyl aluminum ($Al(CH_3)_3$). Aluminum may be sputtered with a power in the range of approximately 10–50 watts of DC power. An alternative p-dopant may be boron, which can be added as gaseous diborane ($B_2H_6$). Alternatively, the dopants can be alloyed with the silicon carbide target.

Figure 6:
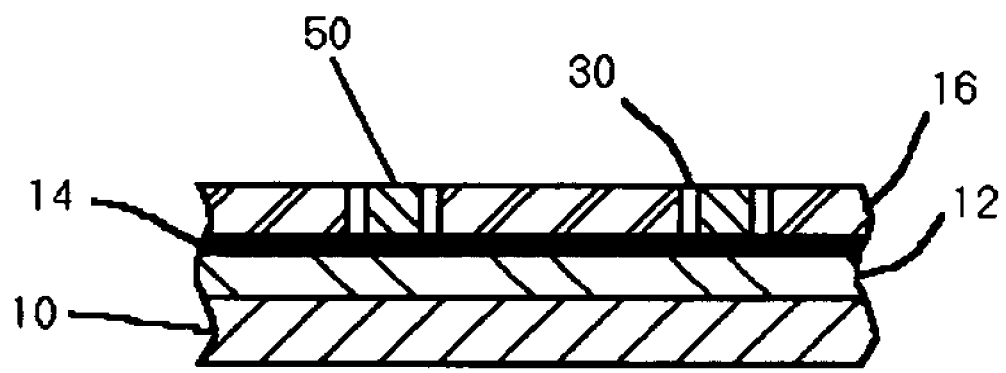
FIG. 6 included an illustration of a cross-sectional view of the substrate of FIG. 5 after removing portions of the heavily doped silicon carbide layer lying outside the openings.

Portions of SiC layer 50 overlying the third active layer 16 may be mechanically or chemically removed to expose portions of layer 16, leaving SiC material 50 at least partially within openings 20, as illustrated in FIG. 6.

Figure 7:
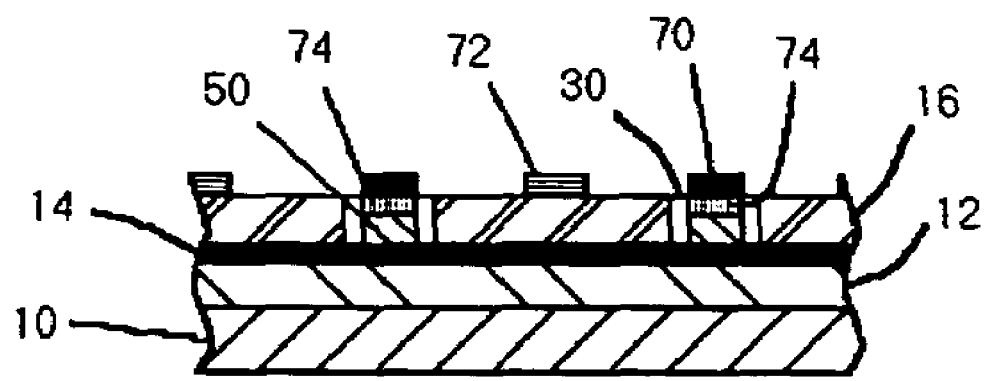
FIG. 7 includes an illustration of a cross-sectional view of the substrate of FIG. 6 after forming metal contacts to the second and third active layers.

Illustrated in FIG. 7, a metal layer 70 may be deposited on the heavily doped silicon carbide 50. The metal layer 70 may be aluminum or any other metal that can form an ohmic contact to p-doped silicon carbide. A metal layer 72 may be deposited on n-doped silicon carbide layer 16. The metal layer 72 on layer 16 can be nickel or any other metal that can form an ohmic contact to n-doped silicon carbide. The metal layers 70 and 72 can be deposited by any of a number of methods, including DC sputtering, RF sputtering, thermal evaporation, e-beam evaporation and chemical vapor deposition. The metal layers 70 and 72 may be patterned by photolithography and wet or dry chemical etching.

The metal layers 70 and 72 can be annealed to form an ohmic electrical connection or contact with the underlying silicon carbide. Depending upon the metal, the annealing temperature may be in a range of approximately 600° C. 1100° C., which is below the melting temperature of the insulating layer 30. Due to the thickness of the heavily doped silicon carbide layer 50, the reaction region 74 between the metal contact 70 and the heavily doped silicon carbide 50 that occurs when the metal is annealed should not extend through the thin layer 14. In this particular embodiment, region 74 does not physically contact layer 14.

Figure 8:
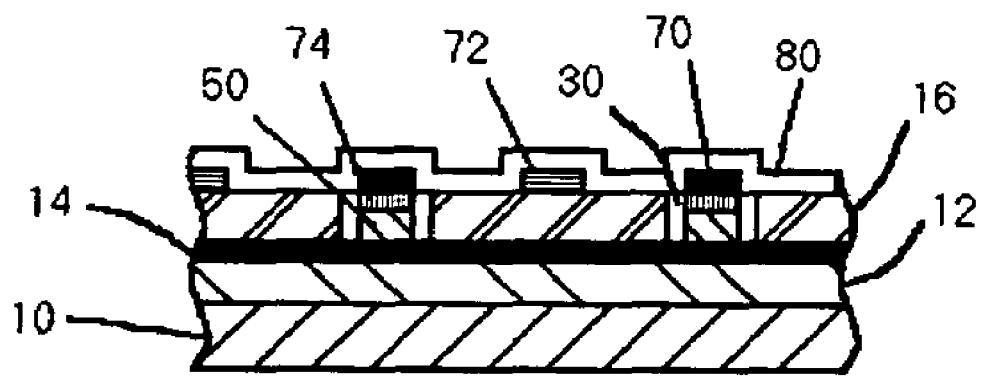
FIG. 8 includes an illustration of a cross-sectional view of the substrate of FIG. 7 after forming an insulating layer over the third active layer and metal contacts.
Figure 9:
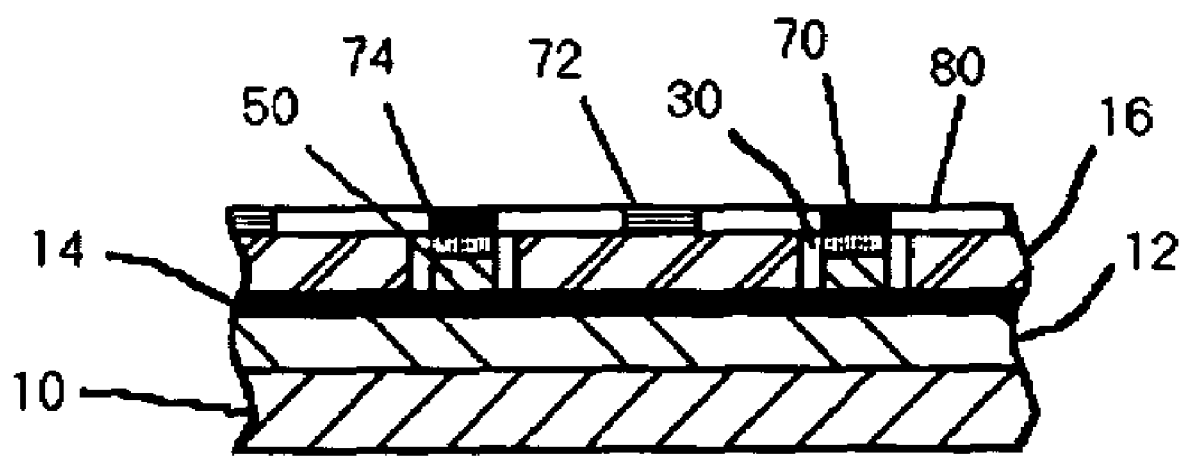
FIG. 9 includes an illustration of a cross-sectional view of the substrate of FIG. 8 after removing a portion of the insulating layer to expose surfaces of the metal contacts.

Insulating layer 80 can be deposited on layer 16 and metal layers 70 and 72 as shown in FIG. 8. Layer 80 may be an insulator such as silicon dioxide, silicon nitride, silicon oxynitride, or the like. The insulating layer 80 may then be mechanically or chemically removed to expose surfaces of metal layers 70 and 72 as illustrated in FIG. 9. Wire leads (not shown) may be soldered, bonded, or otherwise electrically connected to the metal layer 70 and 72 contacts. For basic a transistor operation, an additional wire lead can be attached to layer 12 to form a substantially completed semiconductor device.

Additional compound semiconductor layers having appropriate contacts and conductivity types may be incorporated to create devices such as thyristors.

Accordingly, devices produced can exhibit faster performance because the active layer 14 can be thin and not exhibit high contact resistance or junction spiking. Further, high temperature anneals are not required at stages where insulating material may be damaged, thus processing is simplified and reduced. Also, as shown in FIG. 9, the device has an exposed surface that is substantially planar, making the semiconductor device easier to integrate and make external connections to than conventional multi-leveled devices. Because of the higher band-gap and chemical stability of silicon carbide, devices described herein may be used in higher power applications and at higher temperature or radiation levels than traditional silicon devices. The increased power handling capability and temperature resistance of silicon carbide devices also allows for the manufacture of smaller devices than with conventional silicon devices.

Because of these benefits, transistors produced according to the process described herein may operate in any standard transistor application and are particularly suited for wireless communication base amplifiers or high power switching devices where these devices may be smaller and faster than existing devices. In RF applications such as amplification, the devices may handle approximately 120 volts and up to approximately 5 watts per millimeter perimeter at roughly 3 gigahertz. Power switching devices may handle approximately 2000 volts and may have a switching frequency around 1 megahertz. Devices can be scalable so that greater power levels may be utilized.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

The invention claimed is:

1. A process for forming a contact for a semiconductor device comprising:
    forming a first compound semiconductor layer, wherein the first compound semiconductor material layer includes a first compound semiconductor material and has a first conductivity type dopant;
    forming a second compound semiconductor layer on the first semiconductor layer, wherein the second compound semiconductor layer includes a second compound semiconductor material and has a second conductivity type dopant and the second conductivity type is opposite the first conductivity type;
    forming a third compound semiconductor layer on the second compound semiconductor layer, said third compound semiconductor layer of said first conductivity type dopant, wherein the first, second and third layers are active layers in a transistor device;
    patterning the third compound semiconductor layer to define an opening therein with a wall, said opening exposing a portion of the second active layer; and
    forming a fourth compound semiconductor material upon at least a portion of the exposed second active compound semiconductor layer wherein the fourth compound semiconductor material has the second conductivity type dopant and has a dopant concentration that is higher than the dopant concentration of the second compound semiconductor layer;
    depositing a planar layer of insulating material and patterning the planar layer of insulating material to have contact openings over the third and fourth layer; and
    forming contacts in the openings in the planar layer of insulating material from the surface of the planar layer to the third layer and through the fourth layer to the underlying second layer in order to provide a substantially common plane for the upper surfaces of the contacts to the third and second layers.

2. The process of claim 1, wherein the fourth compound semiconductor material is formed by sputtering.

3. The process of claim 1, wherein each of the first, second, third and fourth compound semiconductor materials include at least two Group IVA elements.

4. The process of claim 1, wherein each of the first, second, third and fourth compound semiconductor materials include silicon carbide.

5. The process of claim 1, further comprising forming a first metal contact of a first type of metal on the third semiconductor layer and forming a second metal contact of a second type of metal on the fourth semiconductor layer.

6. The process of claim 5, wherein an electrical connection between the third compound semiconductor material and the first metal layer is ohmic and an electrical connection between the fourth compound semiconductor and the second metal layer is ohmic.

7. The process of claim 5, wherein the first metal layer comprises aluminum and the second metal layer comprises nickel.

8. A semiconductor device comprising:
    a first active layer including a first compound semiconductor material and having a first conductivity type dopant;

a second active layer including a second compound semiconductor material and having a second conductivity type dopant opposite the first conductivity type, wherein the second active layer contacts the first active layer;

a third active layer including a third compound semiconductor material and having the first conductivity type dopant, wherein the third active layer contacts the second active layer, and a combination of the first, second, and third active layer are at least part of a transistor;

an opening defined by said second and third active layers, said opening extending through the third active layer, said opening contacting and terminating within the second active layer;

one or more sidewall insulating layers within the opening to isolate the opening from the adjacent third layer a fourth compound semiconductor material at least partially within the opening and on the second active layer, wherein the fourth compound semiconductor material has the second conductivity type dopant and a dopant concentration higher than the dopant concentration of the second active layer and is electrically connected to the second active layer; and a planar layer of insulating material on the third layer and over the fourth layer and comprising first and second sets of metal contacts, said contacts separated from each other by said insulating material layer with one set of metal contacts in electrical contact with the third layer, the other set of contacts in electrical contact with the fourth layer, wherein upper surfaces of the metal contacts and the planar layer lie in substantially the same plane.

9. The device of claim 8, where each of the first, second, third, and fourth compound semiconductor material include at least two Group IVA elements.

10. The device of claim 8, where the first, second, third, and fourth compound semiconductor material comprise silicon carbide.

11. The device of claim 8, further comprising electrical contacts to the third active layer and the fourth compound semiconductor material.

12. The device of claim 11, wherein the metal layers are aluminum and nickel, respectively, and the electrical contacts are ohmic.

13. The device of claim 12, wherein the device further comprises a second insulating layer on the surface of the third active.

14. The device of claim 8, wherein the second active layer has a thickness in a range of approximately 0.1–2 microns thick.

* * * * *